(12) United States Patent
Kang et al.

(10) Patent No.: US 12,041,737 B2
(45) Date of Patent: Jul. 16, 2024

(54) DISPLAY DEVICE

(71) Applicant: LG Display Co., Ltd., Seoul (KR)

(72) Inventors: ChounSung Kang, Gimpo-si (KR); Daeyun Kim, Seoul (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 17/746,551

(22) Filed: May 17, 2022

(65) Prior Publication Data

US 2022/0386484 A1 Dec. 1, 2022

(30) Foreign Application Priority Data

May 31, 2021 (KR) .................. 10-2021-0070059

(51) Int. Cl.
*G06F 1/16* (2006.01)
*H05K 5/00* (2006.01)
*H05K 5/02* (2006.01)

(52) U.S. Cl.
CPC ......... *H05K 5/0217* (2013.01); *H05K 5/0017* (2013.01); *H05K 5/0247* (2013.01)

(58) Field of Classification Search
CPC .................................................. H04M 1/0268
See application file for complete search history.

(56) References Cited

U.S. PATENT DOCUMENTS

| | | | | |
|---|---|---|---|---|
| 9,625,946 B2* | 4/2017 | Lee | ...................... | H04M 1/0268 |
| 10,534,402 B1* | 1/2020 | Kim | ...................... | H05K 1/118 |
| 2008/0049003 A1* | 2/2008 | Hasegawa | ............. | G06F 1/1652 |
| | | | | 345/206 |
| 2013/0127799 A1* | 5/2013 | Lee | ...................... | G06F 1/1652 |
| | | | | 345/204 |
| 2017/0031388 A1* | 2/2017 | Han | ...................... | G06F 1/1601 |
| 2017/0196102 A1* | 7/2017 | Shin | ...................... | G06F 1/1605 |
| 2017/0318688 A1* | 11/2017 | Kim | ...................... | H05K 5/0017 |
| 2019/0150300 A1* | 5/2019 | Kim | ...................... | H05K 5/0217 |
| | | | | 361/807 |
| 2019/0278335 A1* | 9/2019 | Yeh | ...................... | G09F 9/301 |
| 2019/0324501 A1* | 10/2019 | Kim | ...................... | H05K 5/0017 |
| 2020/0077194 A1* | 3/2020 | Kim | ...................... | H04R 7/045 |
| 2022/0147104 A1* | 5/2022 | Cho | ...................... | G06F 1/1652 |

FOREIGN PATENT DOCUMENTS

| | | |
|---|---|---|
| KR | 10-2018-0062269 A | 6/2018 |
| KR | 10-2021-0020726 A | 2/2021 |

* cited by examiner

*Primary Examiner* — Anthony Q Edwards
(74) *Attorney, Agent, or Firm* — Seed IP Law Group LLP

(57) ABSTRACT

A display device includes a display panel, a plurality of flexible films electrically connected to one end of the display panel, a source printed circuit board electrically connected to the plurality of flexible films, a roller on which the display panel is wound or unwound, a control printed circuit board disposed in the roller and a wiring sheet including a first wiring line electrically connecting at least one of the plurality of source printed circuit boards and the control printed circuit board. By disposing the wiring sheet in which the first wiring and the sheet are integrated, damage of the first wiring due to repeated winding and unwinding can be minimized.

12 Claims, 11 Drawing Sheets

DISPLAY DEVICE

CROSS-REFERENCE TO RELATED APPLICATIONS

This application claims the priority of Korean Patent Application No. 10-2021-0070059 filed on May 31, 2021, in the Korean Intellectual Property Office, the disclosure of which is incorporated herein by reference.

BACKGROUND

Technical Field

The present disclosure relates to a display device, and more particularly, to a rollable display device which is capable of displaying images even in a rolled state.

Description of the Related Art

As display devices which are used for a monitor of a computer, a television, a cellular phone, or the like, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate such as plastic which is a flexible material so as to be capable of displaying images even though the display device is rolled is getting attention as a next generation display device.

BRIEF SUMMARY

An embodiment of the present disclosure includes a display device in which a flexible flat cable which connects a source printed circuit board and a control printed circuit board and an extending sheet are integrally formed to improve reliability during winding and unwinding.

Another embodiment of the present disclosure provides a display device which is capable of easily changing a placement of a control printed circuit board.

Still another embodiment of the present disclosure provides a display device which reduces a damage of a wiring line which connects a source printed circuit board and a control printed circuit board.

Still another embodiment of the present disclosure provides a display device which disposes a spring in the middle of a roller to apply uniform force to the entire roller.

Still another embodiment of the present disclosure provides a display device which compensates for an alignment error of a plurality of wiring lines and a source printed circuit board and a control printed circuit board due to the increased size of the display device.

Embodiments of the present disclosure are not limited to the above-mentioned embodiments, and other embodiments, which are not mentioned above, can be clearly understood by those skilled in the art from the following descriptions.

A display device according to an aspect of the present disclosure comprises a display panel, a plurality of flexible films electrically connected to one end of the display panel, a source printed circuit board electrically connected to the plurality of flexible films, a roller on which the display panel is wound or unwound, a control printed circuit board disposed in the roller and a wiring sheet including a first wiring line electrically connecting at least one of the plurality of source printed circuit boards and the control printed circuit board. Accordingly, by disposing the wiring sheet in which the first wiring and the sheet are integrated, damage of the first wiring due to repeated winding and unwinding can be reduced or minimized.

A display device according to another aspect of the present disclosure comprises a display panel, a plurality of source printed circuit boards electrically connected to the display panel, a control printed circuit board electrically connected to the plurality of source printed circuit boards, a wiring sheet electrically connecting the plurality of source printed circuit boards and the control printed circuit board; and a roller connected to the wiring sheet and accommodating the control printed circuit boards therein, wherein the spring is disposed in the middle of the roller. Accordingly, by disposing the spring in the middle of the roller, the display panel may be wound around the roller without distortion.

Other detailed matters of the exemplary embodiments are included in the detailed description and the drawings.

According to the present disclosure, for example, a wiring line (e.g. a flexible flat cable) which connects a source printed circuit and a control printed circuit board and a sheet (e.g. an extending sheet) which connects a back cover and a roller are integrally formed as a wiring sheet to minimize the damage or separation of the wiring line.

According to the present disclosure, positions of the control printed circuit board and a first wiring line are easily changed in the roller.

According to the present disclosure, the spring may be disposed in the middle of the roller to minimize the oblique winding of the display device around the roller.

According to the present disclosure, the alignment error of the plurality of wiring lines of the wiring sheet, the plurality of source printed circuit boards, and the control printed circuit board may be compensated.

According to the present disclosure, a contact error of the display device when the display device is wound or unwound may be minimized.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features, and other advantages of the present disclosure will be more clearly understood from the following detailed description taken in conjunction with the accompanying drawings, in which.

DETAILED DESCRIPTION

Figure 1A:
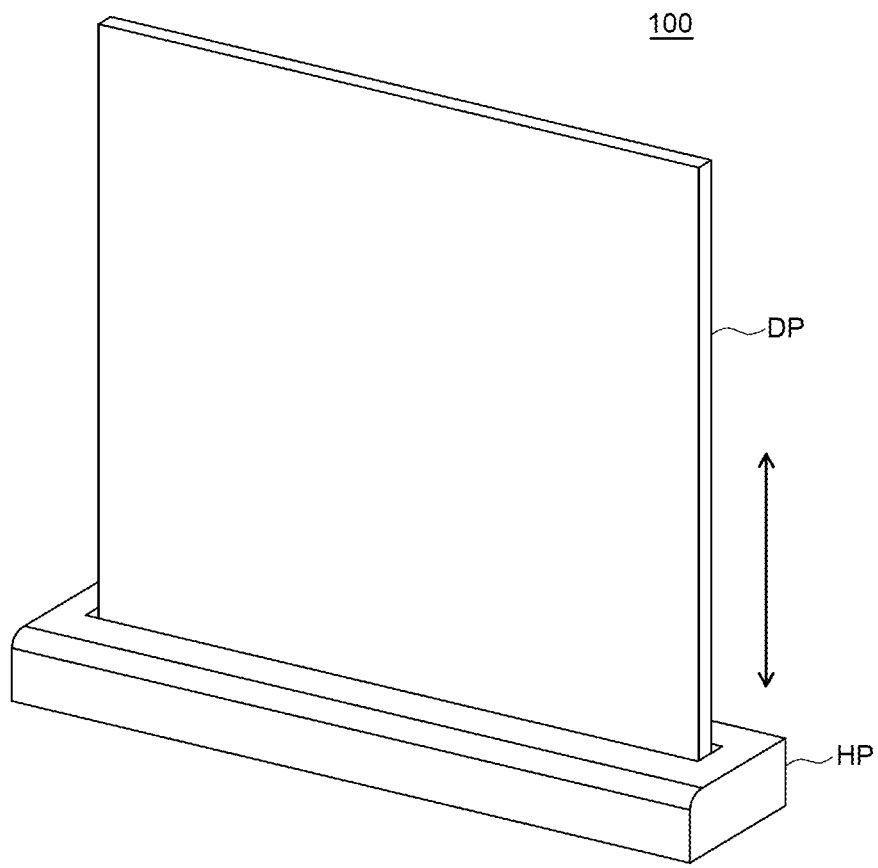
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

A rollable display device may be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
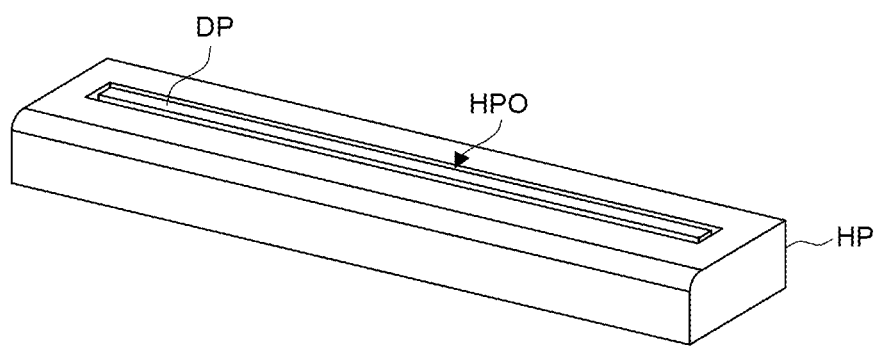

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP.

The display unit DP is a configuration for displaying images to a user and for example, in the display unit DP, a display element and a circuit, a wiring line, a component, and the like for driving the display element may be disposed. In this case, since the display device 100 according to the exemplary embodiment of the present disclosure is a rollable display device, the display unit DP may be configured to be wound or unwound. For example, the display unit DP may be formed of a display panel and a back cover each having flexibility to be wound or unwound. The display unit DP will be described below in more detail with reference to FIGS. 4 to 6.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO to allow the display unit DP to move to the inside and the outside of the housing unit HP. The display unit DP may move in a vertical direction by passing through the opening HPO of the housing unit HP.

In the meantime, the display unit DP of the display device 100 may be switched from a fully unwound state to a fully wound state or from a fully wound state to a fully unwound state.

FIG. 1A illustrates a fully unwound state of the display unit DP of the display device 100 and the fully unwound display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced so that the display device 100 may be easily carried.

In the meantime, in order to switch the display unit DP to a fully unwound state or a fully wound state, a driving unit MP which winds or unwinds the display unit DP is disposed.

Figure 2:
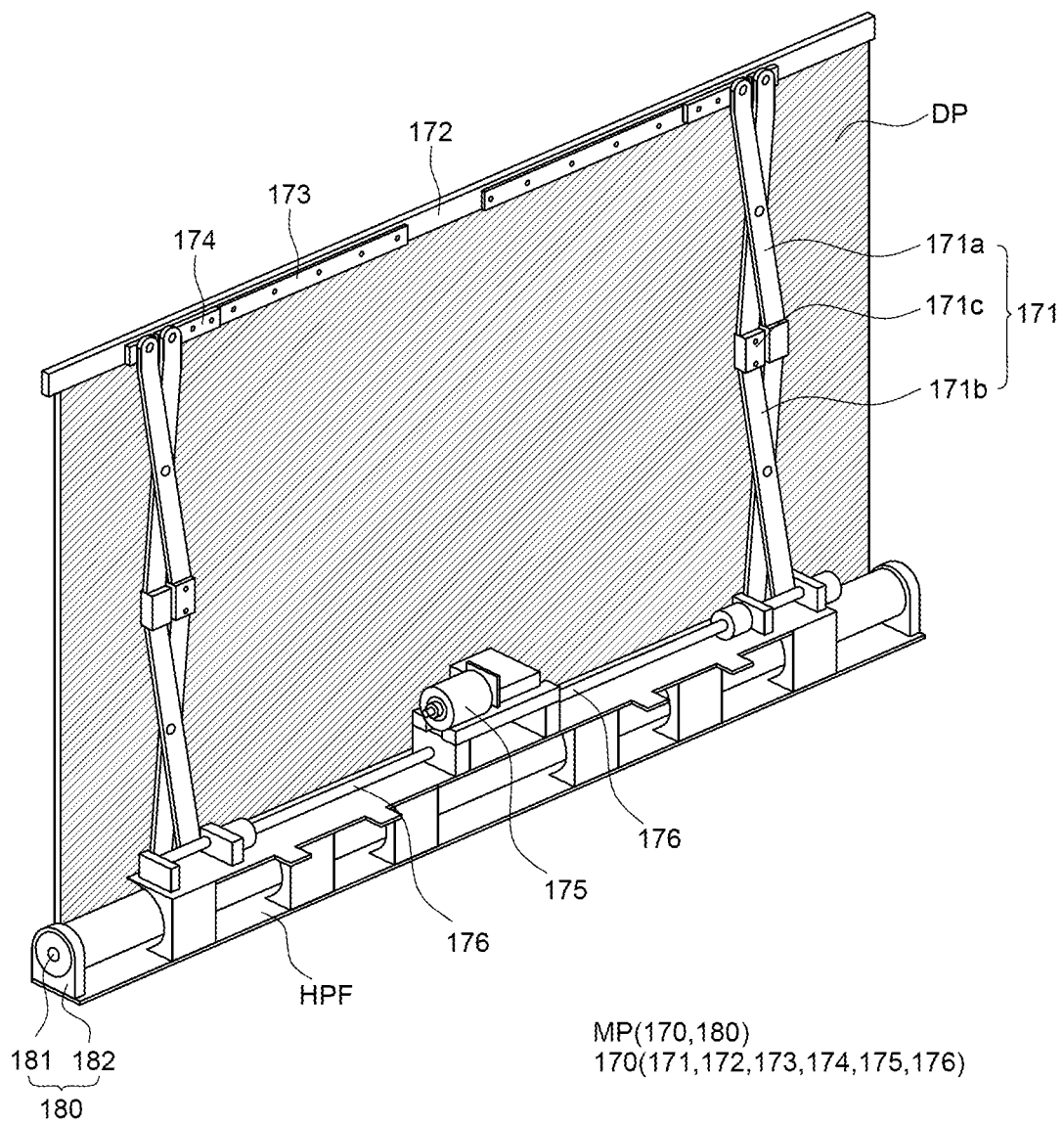
FIG. 2 is a perspective view of a display device according to an exemplary embodiment of the present disclosure.
Figure 3:
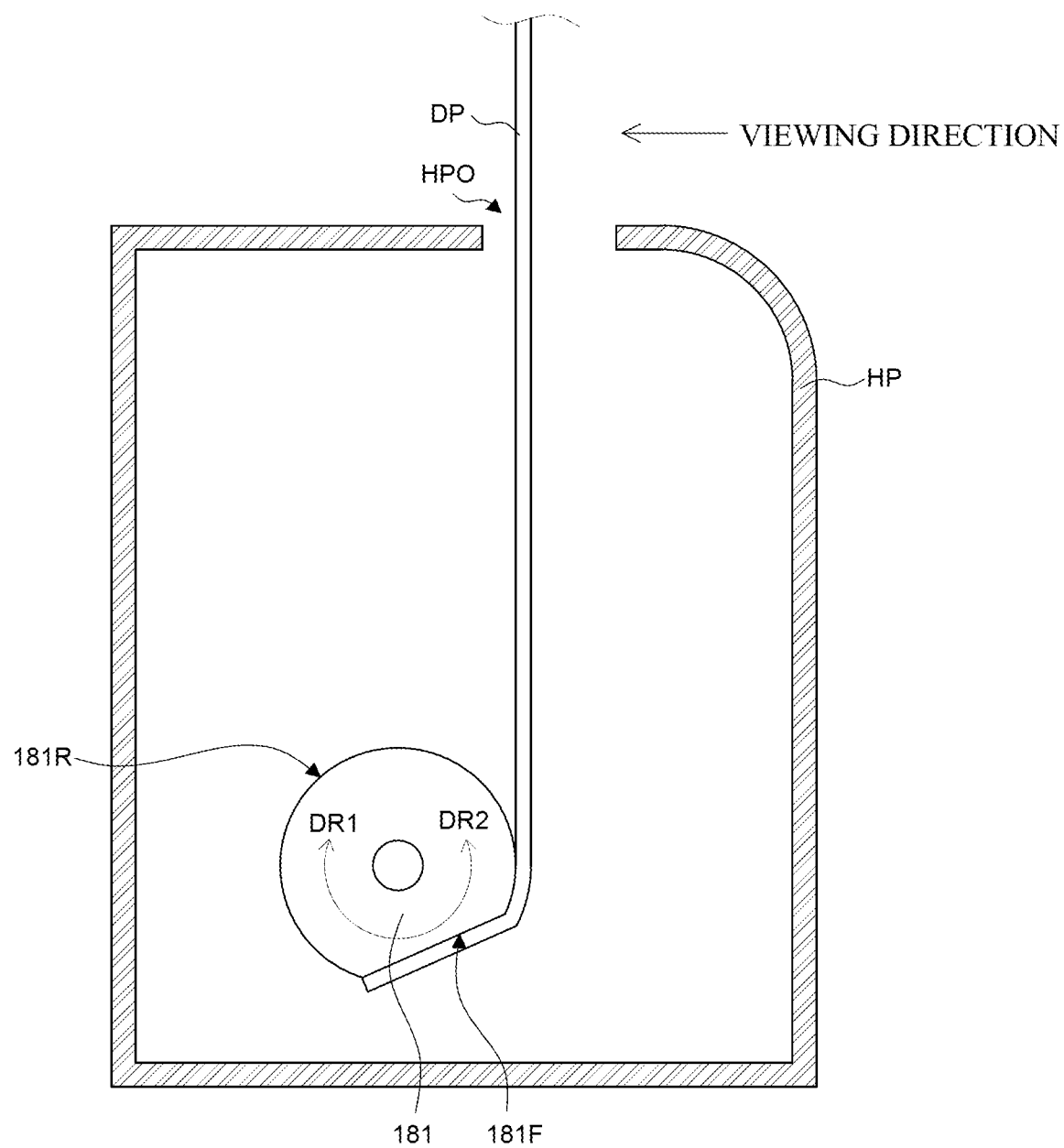
FIG. 3 is a schematic cross-sectional view of a display device according to an exemplary embodiment of the present disclosure.

FIG. 2 is a perspective view of a display device according to an exemplary embodiment of the present disclosure. FIG. 3 is a schematic cross-sectional view of a display device according to an exemplary embodiment of the present disclosure. FIG. 3 is a schematic cross-sectional view for explaining a roller 181 and a display unit DP of a display device 100 according to an exemplary embodiment of the present disclosure. For the convenience of description, in FIG. 2, a spring and a rotary shaft in the roller 181 are not illustrated and in FIG. 3, only the housing unit HP, the roller 181, and the display unit DP are illustrated.

First, referring to FIG. 2, a driving unit MP includes a roller unit 180 and a lifting unit 170.

The roller unit 180 rotates in a clockwise direction or a counterclockwise direction to wind or unwind the display unit DP fixed to the roller unit 180. The roller unit 180 includes a roller 181 and a roller support unit 182.

The roller 181 is a member around which the display unit DP is wound. The roller 181 may be, for example, formed to have a cylindrical shape. A lower edge of the display unit DP may be fixed to the roller 181. When the roller 181 rotates, the display unit DP which is fixed to the roller 181 through the lower edge may be wound around the roller 181. In contrast, when the roller 181 rotates in an opposite direction, the display unit DP which is wound around the roller 181 may be unwound from the roller 181.

Referring to FIG. 3, the roller 181 may be formed to have a cylindrical shape in which at least a part of an outer circumferential surface of the roller 181 is flat and the remaining part of the outer circumferential surface is a curved portion. Even though the roller 181 may have entirely a cylindrical shape, a part thereof may be formed of a flat surface. That is, a part of the outer circumferential surface of the roller 181 is formed to be flat and the remaining part of the outer circumferential surface is formed to be a curved surface. For example, the roller 181 may be configured by a curved portion 181R and a flat portion 181F. However, the roller 181 may have a completely cylindrical shape or an arbitrary shape which may wind the display unit DP, but is not limited thereto.

Referring to FIG. 2 again, the roller support unit 182 supports the roller 181 at both sides of the roller 181. Specifically, the roller support unit 182 is disposed on a bottom surface HPF of the housing unit HP. Upper side surfaces of the roller support unit 182 are coupled to both ends of the roller 181. By doing this, the roller support unit 182 may support the roller 181 to be spaced apart from the bottom surface HPF of the housing unit HP. In this case, the roller 181 may be rotatably coupled to the roller support unit 182.

The lifting unit 170 moves the display unit DP in a vertical direction in accordance with the driving of the roller unit 180. The lifting unit 170 includes a link unit 171, a head bar 172, a slide rail 173, a slider 174, a motor 175, and a rotary unit 176.

The link unit 171 of the lifting unit 170 includes a plurality of links 171a and 171b and a hinge unit 171c which connects the plurality of links 171a and 171b to each other. Specifically, the plurality of links 171a and 171b includes a first link 171a and a second link 171b and the first link 171a and the second link 171b cross each other in the form of scissors to be rotatably fastened by means of the hinge unit 171c. When the link unit 171 moves in the vertical direction, the plurality of links 171a and 171b may rotate to be far away from each other or close to each other.

The head bar 172 of the lifting unit 170 is fixed to an uppermost end of the display unit DP. The head bar 172 is coupled to the link unit 171 to move the display unit DP in the vertical direction in accordance with the rotation of the plurality of links 171a and 171b of the link unit 171. That is, the display unit DP may move in a vertical direction by the head bar 172 and the link unit 171.

The head bar 172 covers only a part of a surface which is adjacent to an uppermost edge of the display unit DP so as not to hide an image displayed on the front surface of the display unit DP. The display unit DP and the head bar 172 may be fixed by a screw, but are not limited thereto.

The slide rail 173 of the lifting unit 170 provides a movement path of the plurality of links 171a and 171b. Parts of the plurality of links 171a and 171b are rotatably fastened with the slide rail 173 so that the motion may be guided along a trajectory of the slide rail 173. Parts of the plurality of links 171a and 171b are fastened with the slider 174 which is movably provided along the slide rail 173 to move along the trajectory of the slide rail 173.

The motor 175 is connected to a power generating unit, such as a separate external power source or a built-in battery, to be supplied with the power. The motor 175 generates a torque to provide a driving force to the rotary unit 176.

The rotary unit 176 is connected to the motor 175 to be configured to convert a rotational motion from the motor 175 into a linear reciprocating motion. That is, the rotational motion of the motor 175 may be converted into the linear reciprocating motion of a structure fixed to the rotary unit 176. For example, the rotary unit 176 may be implemented by a ball screw including a shaft and a nut which is fastened with the shaft, but is not limited thereto.

The motor 175 and the rotary unit 176 interwork with the link unit 171 to lift and lower the display unit DP. The link unit 171 is formed with a link structure to receive the driving force from the motor 175 and the rotary unit 176 to be repeatedly folded or unfolded.

Specifically, when the display unit DP is wound, the motor 175 is driven so that the structure of the rotary unit 176 may perform the linear motion. That is, a part of the rotary unit 176 to which one end of the second link 171b is coupled may perform the linear motion. Therefore, one end of the second link 171b may move to the motor 175 and the plurality of links 171a and 171b is folded so that the height of the link unit 171 may be lowered. Further, while the plurality of links 171a and 171b is folded, the head bar 172 coupled to the first link 171a is also lowered and one end of the display unit DP coupled to the head bar 172 is also lowered.

When the display unit DP is unwound, the motor 175 is driven so that the structure of the rotary unit 176 may perform the linear motion. That is, a part of the rotary unit 176 to which one end of the second link 171b is coupled may perform the linear motion. Therefore, one end of the second link 171b may move to be away from the motor 175 and the plurality of links 171a and 171b is unfolded so that the height of the link unit 171 may be increased. Further, when the plurality of links 171a and 171b is unfolded, the head bar 172 coupled to the first link 171a is also lifted and one end of the display unit DP coupled to the head bar 172 is also lifted.

Accordingly, when the display unit DP is fully wound around the roller 181, the link unit 171 of the lifting unit 170 maintains a folded state. That is, when the display unit DP is fully wound around the roller 181, the lifting unit 170 may have a smallest height. When the display unit DP is fully unwound, the link unit 171 of the lifting unit 170 maintains an unfolded state. That is, when the display unit DP is fully unwound, the lifting unit 170 may have a largest height.

In the meantime, when the display unit DP is wound, the roller 181 may rotate and the display unit DP may be wound around the roller 181. Referring to FIG. 3, a lower edge of the display unit DP is coupled to the roller 181. When the roller 181 rotates in a first direction DR1, that is, a clockwise direction, the display unit DP may be wound while a rear surface of the display unit DP is in close contact with the surface of the roller 181.

When the display unit DP is unwound, the roller 181 may rotate and the display unit DP may be unwound from the roller 181. For example, referring to FIG. 3, when the roller 181 rotates in a second direction DR2, that is, in a counterclockwise direction, the display unit DP which is wound around the roller 181 is unwound from the roller 181 to be disposed at the outside of the housing unit HP.

In some exemplary embodiments, a driving unit MP having another structure other than the above-described driving unit MP may be applied to the display device 100. That is, as long as the display unit DP is capable of being wound and unwound, the above-described configuration of the roller unit 180 and the lifting unit 170 may be modified, some configurations may be omitted, or another configuration may be added.

Figure 4:
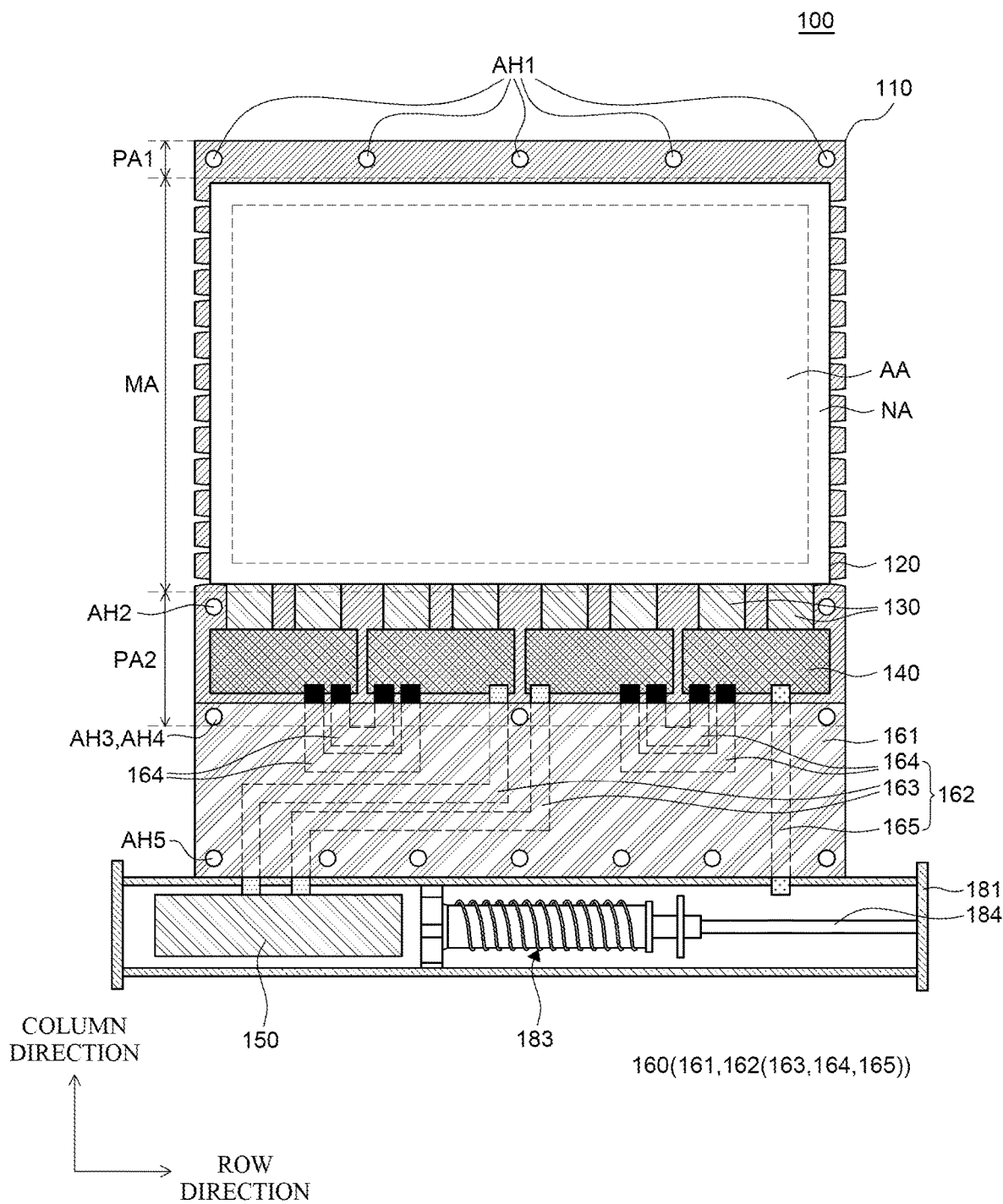
FIGS. 4 and 5 are plan views of a display unit of a display device according to an exemplary embodiment of the present disclosure.
Figure 5:
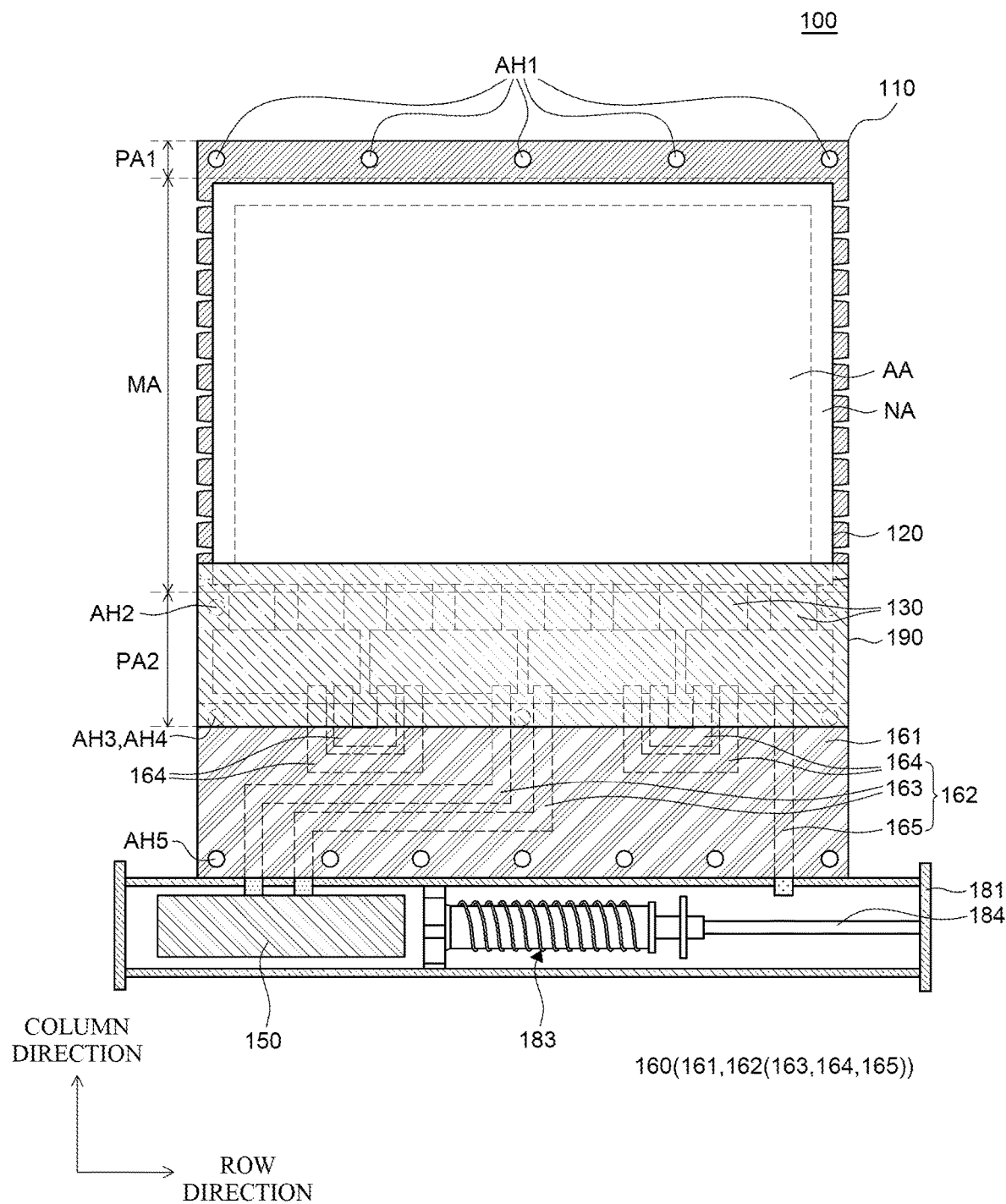
Figure 6:
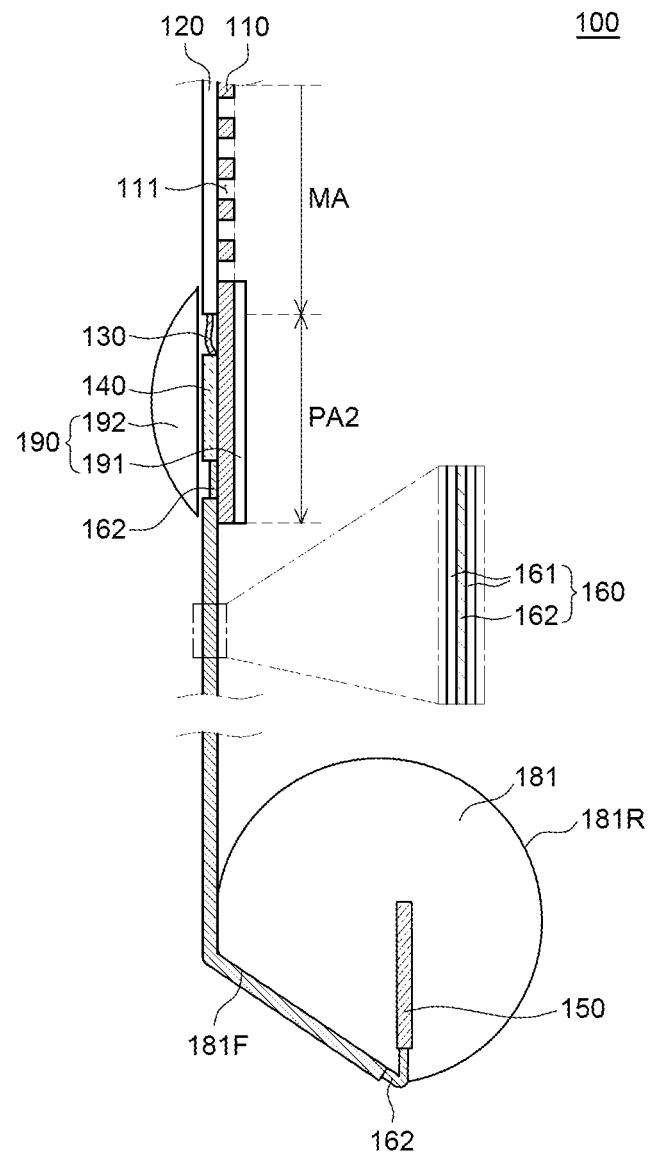
FIG. 6 is a cross-sectional view of a display device according to an exemplary embodiment of the present disclosure.

FIGS. 4 and 5 are plan views of a display unit of a display device according to an exemplary embodiment of the present disclosure. FIG. 6 is a cross-sectional view of a display device according to an exemplary embodiment of the present disclosure. Referring to FIGS. 4 to 6, the display unit DP includes a back cover 110, a display panel 120, a plurality of flexible films 130, a plurality of source printed circuit boards 140, a control printed circuit board 150, a wiring sheet 160, and a cover unit 190. For the convenience of description, in FIG. 4, the cover unit 190 is not illustrated and in FIG. 6, only the display unit DP and the roller 181 are illustrated.

Referring to FIGS. 4 and 5, the back cover 110 is disposed on a rear surface of the display panel 120 to support the display panel 120, the plurality of flexible films 130, and the plurality of source printed circuit boards 140. A size of the back cover 110 may be larger than a size of the display panel 120. The back cover 110 may protect other configurations of the display unit DP from the outside.

Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar, plastic, or the like. However, if the material of the back cover 110 satisfies physical conditions such as a thermal strain amount, a radius of curvature, and a rigidity, the material may be diversely changed depending on the design, and is not limited thereto.

The back cover 110 includes a plurality of support areas PA and a malleable area MA. The plurality of support areas PA is areas where a plurality of openings 111 is not disposed and the malleable area MA is an area where a plurality of openings 111 is disposed. For example, a first support area PA1, the malleable area MA, and a second support area PA2 are sequentially disposed from the uppermost end of the back cover 110. A plurality of fastening holes is formed in each of the plurality of support areas PA. Specifically, in the first support area PA1, a first fastening hole AH1 is formed and in the second support area PA2, a second fastening hole AH2 and a third fastening hole AH3 are formed.

The first support area PA1 is an uppermost area of the back cover 110 and is fastened with the head bar 172. The first support area PA1 may include first fastening holes AH1 to be fastened with the head bar 172. For example, screws which pass through the head bar 172 and the first fastening holes AH1 are disposed so that the head bar 172 may be fastened with the first support area PA1 of the back cover 110. As the first support area PA1 is fastened with the head bar 172, when the link unit 171 which is fastened with the head bar 172 is lifted or lowered, the back cover 110 may be also lifted and lowered together with the display panel 120 attached to the back cover 110.

The malleable area MA is an area extending from the first support area PA1 to a lower side of the back cover 110. The malleable area MA is an area in which a plurality of openings 111 is disposed and the display panel 120 is attached. Specifically, the malleable area MA is an area which is wound around or unwound from the roller 181 together with the display panel 120. The malleable area MA may overlap at least the display panel 120 among other configurations of the display unit DP.

The second support area PA2 extends from the malleable area MA to the lower side of the back cover 110. The second support area PA2 is an area fastening with the cover unit 190 and the wiring sheet 160. In the second support area PA2, the second fastening hole AH2 and the third fastening hole AH3 may be formed to be fastened with the cover unit 190 and the wiring sheet 160. For example, screws which pass through the cover unit 190 and the second fastening hole HA2 and the third fastening hole AH3 are disposed so that the cover unit 190 and the second support area PA2 of the back cover 110 are fastened with each other. Screws which pass through the wiring sheet 160 and the third fastening hole AH3 are disposed so that the wiring sheet 160 may be fastened with the second support area PA2.

In the meantime, in FIG. 4, even though it is illustrated that the plurality of support areas PA and the malleable area MA of the back cover 110 are sequentially disposed along the column direction, when the back cover 110 is wound in the row direction, the plurality of support areas PA and the malleable area MA may be disposed along a row direction.

Even though in FIGS. 4 and 5, five first fastening holes AH1, two second fastening holes AH2, and three third fastening holes AH3 are illustrated, the numbers of first fastening holes AH1, second fastening holes AH2, and third fastening holes AH3 are not limited thereto. Further, in FIG. 4, it is described that the back cover 110 is fastened with the head bar 172 using the first fastening holes AH1 and is fastened with the cover unit 190 and the wiring sheet 160 using the second fastening holes AH2 and the third fastening holes AH3. However, the present disclosure is not limited thereto and the back cover 110 may be fastened with the head bar 172, the wiring sheet 160, and the cover unit 190 without using a separate fastening hole.

In the meantime, when the display unit DP is wound or unwound, the plurality of openings 111 disposed in the malleable area MA of the back cover 110 may be deformed by a stress which is applied to the display unit DP. Specifically, when the display unit DP is wound or unwound, the malleable area MA of the back cover 110 may be deformed as the plurality of openings 111 contracts or expands. Further, as the plurality of openings 111 contracts or expands, a slip phenomenon of the display panel 120 disposed on the malleable area MA of the back cover 110 is minimized so that the stress which is applied to the display panel 120 may be minimized.

When the display panel 120 and the back cover 110 are wound, a difference between a length of the display panel 120 which is wound around the roller 181 and a length of the back cover 110 which is wound around the roller 181 may be caused due to the difference of radii of curvature of the display panel 120 and the back cover 110. For example, when the back cover 110 and the display panel 120 are wound around the roller 181, a length of the back cover 110 required for being wound around the roller 181 once may be different from a length of the display panel 120 required for being wound around the roller 181 once. That is, since the display panel 120 is disposed outer than the back cover 110 with respect to the roller 181, a length of the display panel 120 required for being wound around the roller 181 once may be larger than a length of the back cover 110 required for being wound around the roller 181 once. As described above, the winding lengths of the back cover 110 and the display panel 120 are different from each other due to the difference of radii of curvature during the winding of the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or defects such as cracks may be caused.

In the meantime, in the first support area PA1 and the second support area PA2, the plurality of openings 111 as formed in the malleable area MA is not formed. Specifically, only the first fastening hole AH1, the second fastening hole AH2, and the third fastening hole AH3 are formed in the first support area PA1 and the second support area PA2, but the plurality of openings 111 as formed in the malleable area MA is not formed in the first support area PA1 and the second support area PA2. Further, the first fastening holes AH1, the second fastening holes AH2, and the third fastening holes AH3 have different shapes from that of the plurality of openings 111. The first support area PA1 is an area fixed to the head bar 172 and the second support area PA2 is an area connected to the cover unit 190 and the wiring sheet 160 and the first support area PA1 and the second support area PA2 may have a rigidity stronger than the malleable area MA. Accordingly, in order to allow the first support area PA1 and the second support area PA2 to have the rigidity, the plurality of openings 111 may not be formed in the first support area PA1 and the second support area PA2.

In the display device 100 according to an exemplary embodiment of the present disclosure, even though the display unit DP is wound or unwound and a stress is applied to the display unit DP, the plurality of openings 111 of the back cover 110 may be flexibly deformed. Accordingly, the stress applied to the back cover 110 and the display panel 120 may be alleviated. For example, when the back cover 110 and the display panel 120 are wound around the roller 181 along the column direction, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, a stress which is applied to the display panel 120 from the back cover 110 due to the deformation of the plurality of openings 111 during the process of winding the back cover 110 and the display panel 120 may also be alleviated.

The display panel 120 is disposed on one surface of the back cover 110. The display panel 120 is disposed in the malleable area MA, on one surface of the back cover 110. For example, the display panel 120 may be attached to the back cover 110 by means of an adhesive layer.

The display panel 120 is a panel for displaying images to a user. The display panel 120 may include a display element which displays images, a driving element which drives the display element, wiring lines which transmit various signals to the display element and the driving element, and the like.

The display element may be defined in different manners depending on the type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Further, since the display device 100 according to the exemplary embodiment of the present disclosure is a rollable display device, the display panel 120 may be implemented as a flexible display panel 120 to be wound around or unwound from the roller 181.

Referring to FIG. 4, the display panel 120 includes an active area AA and a non-active area NA.

The active area AA is an area where images are displayed in the display panel 120. In the active area AA, a plurality of sub pixels which configures the plurality of pixels and a driving circuit for driving the plurality of sub pixels may be disposed. The plurality of sub pixels is minimum units which configure the active area AA and a display element may be disposed in each of the plurality of sub pixels. For example, a driving circuit for driving the plurality of sub pixels may include a driving element, a wiring line, and the like. For example, the driving circuit may be configured by a thin film transistor, a storage capacitor, a gate line, a data line, and the like, but is not limited thereto.

The non-active area NA is an area where no image is displayed. In the non-active area NA, various wiring lines, circuits, and the like for driving the display element of the active area AA are disposed. For example, in the non-active area NA, a link line which transmits signals to the plurality of sub pixels and driving circuits of the active area AA or a driving IC such as a gate driver IC or a data driver IC may be disposed, but the non-active area is not limited thereto.

At least one or more flexible films 130 are disposed at one end of the display panel 120. For example, one or a plurality of flexible films 130 may be disposed depending on the design. Hereinafter, for the convenience of description, even though it is described that a plurality of flexible films 130 is disposed, the number of flexible films 130 may vary depending on the design and is not limited thereto.

The plurality of flexible films 130 may be electrically connected to the non-active area NA at one end of the display panel 120. The plurality of flexible films 130 is films in which various components are disposed on a base film having a malleability to supply a signal to the plurality of sub pixels and the driving circuits of the active area AA and may be electrically connected to the display panel 120. One ends of the plurality of flexible films 130 are disposed in the non-active area NA of the display panel 120 to supply a power voltage or a data voltage to the plurality of sub pixels and the driving circuits of the active area AA.

In the meantime, a driving IC such as a gate driver IC or a data driver IC may be disposed on the plurality of flexible films 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the plurality of flexible films 130 by a chip on film technique, but is not limited thereto.

The plurality of source printed circuit boards 140 which is electrically connected to the plurality of flexible films 130 is disposed. The plurality of source printed circuit boards 140 is disposed on the second support area PA2 of the back cover 110 to be connected to the plurality of flexible films 130. The plurality of source printed circuit boards 140 is components which supply signals to the driving IC. Various components may be disposed in the plurality of source printed circuit boards 140 to supply various signals such as a driving signal or a data signal to the driving IC. In the meantime, in FIG. 4, it is illustrated that four source printed circuit boards 140 are disposed and each source printed circuit board 140 is connected to two flexible films 130. However, the number of the plurality of source printed circuit boards 140 may vary depending on the design and is not limited thereto. For example, only one source printed circuit board 140 may be disposed in the second support area PA2, or the plurality of source printed circuit boards 140 may include two, three, or more than four source printed circuit boards 140 disposed in the second support area PA2.

Referring to FIGS. 5 and 6 together, a cover unit 190 which covers the plurality of source printed circuit boards 140 and the plurality of flexible films 130 is disposed. The cover unit 190 may be disposed to cover at least the second support area PA2 of the back cover 110. For example, the cover unit 190 may cover a part of the non-active area NA of the display panel 120 adjacent to the second support area PA2, and the plurality of flexible films 130 and the plurality of source printed circuit boards 140 disposed in the second support area PA2. By doing this, the cover unit 190 may protect the display panel 120, the plurality of flexible films 130, and the plurality of source printed circuit boards 140 from the external impact.

The cover unit 190 includes a base plate 191 and a cover plate 192.

The base plate 191 is disposed on an opposite surface of one surface of the back cover 110. The base plate 191 may be fixed to the second support area PA on the opposite surface of one surface of the back cover 110 on which the display panel 120 is not disposed. The base plate 191 may be disposed so as to overlap the plurality of source printed circuit boards 140 with the back cover 110 therebetween. The base plate 191 may support the plurality of source printed circuit boards 140 disposed in the second support area PA2. For example, the base plate 191 is formed of a material having a rigidity to support the second support area PA2 to be flat, but is not limited thereto.

The cover plate 192 is disposed on one surface of the back cover 110. The cover plate 192 may be disposed to cover at least the plurality of source printed circuit boards 140 among the components of the display unit DP. For example, the cover plate 192 may be disposed to cover the non-active area NA of the display panel 120, the plurality of flexible films 130, and the plurality of source printed circuit boards 140. The cover plate 192 may be fixed to the second support area PA2 and the base plate 191 on one surface of the back cover 110 on which the display panel 120 and the plurality of source printed circuit boards 140 are disposed. The cover plate 192 may be formed with one surface which is convex, that is, a curved surface. The cover plate 192 is formed of a material having a rigidity to protect the plurality of source printed circuit boards 140, but is not limited thereto.

In the meantime, the cover unit 190 and the back cover 110 may be fixed to each other. For example, the second fastening hole AH2 and the third fastening hole AH3 are formed in the second support area PA2 and a protrusion protruding from the base plate 191 is inserted into the second fastening hole AH2 and the third fastening hole HA3 to fix the cover unit 190 and the back cover 110. Further, as another example, the cover unit 190 and the back cover 110 may be fixed to each other by a member such as a screw which passes through the base plate 191, the cover plate 192, and the back cover 110. At this time, the fastening member such as a screw may be disposed so as not to interfere with the plurality of source printed circuit boards 140. However, the cover unit 190 and the back cover 110 may be fixed by various methods, but are not limited thereto.

The cover unit 190 is formed of a material having a rigidity to maintain its original state without being bent when the display unit DP is wound to protect the plurality of source printed circuit boards 140. When the display unit DP is wound, the cover plate 192 is not deformed, but maintains its original convex shape to protect the plurality of source printed circuit boards 140 so as to suppress a part of the back cover 110 and the display panel 120 wound on the cover plate 192 not to impact the plurality of source printed circuit boards 140. The cover plate 192 having a curved surface may form a circle with the curved portion 181R of the roller 181 and the remaining component of the display unit DP which is wound on the cover unit 190 may be wound with a predetermined curvature.

Next, when the display unit DP is wound, the base plate 191 of the cover unit 190 having the rigidity maintains a flat state without being bent to protect the source printed circuit board 140. A part of the roller 181 around which the base plate 191 is wound may be formed as a flat surface so that the base plate 191 is not bent. For example, the base plate 191 is seated on the flat portion 181F of the roller 181 to maintain a flat state without being bent even though the display unit DP is wound.

Referring to FIGS. 4 and 6, the wiring sheet 160 is disposed between the back cover 110 and the roller 181. One end of the wiring sheet 160 is fastened with the second support area PA2 of the back cover 110 and the other end is fastened with the roller 181. The wiring sheet 160 may connect the back cover 110 and the display panel 120 to the roller 181 and the wiring sheet 160, the back cover 110, and the display panel 120 are wound around the roller 181 or unwound from the roller 181 in accordance with the rotation of the roller 181. The wiring sheet 160 may electrically connect the plurality of source printed circuit boards 140 to the control printed circuit board 150 to be described below.

The wiring sheet 160 may include a plurality of wiring lines 162 and one pair of sheets 161 bonded with the plurality of wiring lines 162 therebetween.

The plurality of wiring lines 162 includes a first wiring line 163, a second wiring line 164, and a ground line 165. The first wiring line 163 is a wiring line which electrically connects the plurality of source printed circuit boards 140 to the control printed circuit board 150. At least a part of the first wiring line 163 extends to the outside of the pair of sheets 161 to be connected to the plurality of source printed circuit boards 140 and the control printed circuit board 150. One end of the first wiring line 163 extends to the outside of one pair of sheets 161 to be connected to one of the plurality of source printed circuit boards 140 and the other end extends to the outside of one pair of sheets 161 to be connected to the control printed circuit board 150 in the roller 181. Even though in the drawing, two first wiring lines 163 are illustrated, depending on the design, one or a plurality of first wiring lines 163 may be disposed and the number of first wiring lines 163 is not limited thereto.

The second wiring line 164 is a wiring line which electrically connects the plurality of source printed circuit boards 140. The second wiring line 164 may electrically connect the source printed circuit board 140 which is connected to the control printed circuit board 150 by means of the first wiring line 163 to the source printed circuit board 140 which is not directly connected to the control printed circuit board 150. One end and the other end of the second wiring line 164 extend to the outside of one pair of sheets 161 to electrically connect source printed circuit boards 140 which are adjacent to each other. Accordingly, the source printed circuit board 140 which is supplied with a signal from the control printed circuit board 150 may transmit a signal to the adjacent source printed circuit board 140 by means of the second wiring line 164.

The ground line 165 is a wiring line which electrically connects some components of the display unit DP and the roller 181 to discharge static electricity which may be generated in the display unit DP. The roller 181 is electrically grounded and the roller 181 and the display unit DP are electrically connected to discharge static electricity generated due to the friction caused by the repeated winding and unwinding. For example, the ground line 165 is connected to the plurality of source printed circuit boards 140 and the cover unit 190, among the components of the display unit DP and the roller 181 to discharge static electricity generated in the display unit DP. However, a component other than the roller 181 may be grounded and the ground line 165 may be connected to components other than the plurality of source printed circuit boards 140 and the cover unit 190, but is not limited thereto.

One pair of sheets 161 may be bonded to each other with the first wiring line 163 and the second wiring line 164 therebetween. One pair of sheets 161 may be a flexible film formed of plastic. For example, one pair of sheets may be formed of a plastic material such as polyethylene (PE), polyethylene terephthalate, (PET), polyvinyl chloride (PVC), polyvinyl alcohol (PVA), polycarbonate (PC), polystyrene (PS), or polyurethane (PUR), but is not limited thereto.

One pair of sheets 161 encloses the plurality of wiring lines 162 to protect the plurality of wiring lines 162 and connects the back cover 110 and the roller 181 to allow the back cover 110 and the display panel 120 to be wound around the roller 181. At this time, in one pair of sheets 161, a plurality of fourth fastening holes AH4 and fifth fastening holes AH5 may be formed. For example, the plurality of fourth fastening holes AH4 may be formed at an upper portion of one pair of sheets 161 to be fastened with the second support area PA2 of the back cover 110. A plurality of fifth fastening holes AH5 may be formed at a lower portion of one pair of sheets 161 to be fastened with the roller 181. Accordingly, one pair of sheets 161 may be fastened with the back cover 110 and the roller 181 by means of the plurality of fourth fastening holes AH4 and fifth fastening holes AH5.

At this time, the wiring sheet 160, the back cover 110, and the cover unit 190 may be fastened by means of the plurality of fourth fastening holes AH4 of the wiring sheet 160 and the plurality of third fastening holes AH3 of the back cover 110. For example, screws which pass through the plurality of third fastening holes AH3, the plurality of fourth fastening holes AH4, and the cover unit 190 are disposed to fix the wiring sheet 160, the back cover 110, and the cover unit 190. However, the wiring sheet 160 may be fastened with only any one of the back cover 110 and the cover unit 190 and may be fastened with the back cover 110 by a different method, but is not limited thereto.

However, even though in the drawing, three fourth fastening holes AH4 and seven fifth fastening holes AH5 are illustrated, the numbers of fourth fastening holes AH4 and fifth fastening holes AH5 are not limited thereto. Further, in the drawing, it has been described that the wiring sheet 160, the back cover 110, and the cover unit 190 are fastened using the third fastening holes AH3 and the fourth fastening holes AH4 and the wiring sheet 160 and the roller 181 are fastened using the fifth fastening holes AH5. However, the present disclosure is not limited thereto and the back cover 110, the wiring sheet 160, and the roller 181 may be fastened with each other without using a separate fastening hole.

The control printed circuit board 150 is disposed in the roller 181. The control printed circuit board 150 supplies various control signals to the plurality of source printed circuit boards 140. For example, a timing controller, etc., is mounted in the control printed circuit board 150 to supply various control signals to the plurality of source printed circuit boards 140.

The spring 183 is disposed in the roller 181. The spring 183 is disposed in the roller 181 to be connected to the rotary shaft 184 of the roller 181. One end of the spring 183 is connected to an inner circumferential surface of the roller 181 and the other end of the spring 183 is connected to the rotary shaft 184. One end of the spring 183 rotates in a clockwise direction or a counterclockwise direction in accordance with a rotation direction of the roller 181 to store the energy in the spring 183. The energy stored in the spring 183 may help the rotation of the roller 181 and help the display unit DP to be smoothly wound around or unwound from the roller 181.

In the meantime, in the roller 181, the spring 183 may be disposed in the middle of the roller 181 and the control printed circuit board 150 may be disposed to be adjacent to a side surface of the roller 181. When the spring 183 is disposed to be leaned to the left side or the right side, rather than in the middle of the roller 181, it is difficult to uniformly transmit the energy stored in the spring 183 to the entire roller 181 and the display unit DP may be obliquely wound around the roller 181. Therefore, the spring 183 is disposed in the middle of the roller 181 to uniformly transmit the energy to the entire roller 181 and wind the display unit DP around the roller 181 without being biased.

In the meantime, according to the related art, a sheet which connects the back cover and the roller, and a flexible flat cable which is a wiring line connecting the plurality of source printed circuit boards and the control printed circuit board are separately configured. In this case, it is necessary to adjust a length of the cable due to the difference in curvatures between the sheet and the cable. However, there may be a problem in that the cable is separated or bent from the source printed circuit board and the control printed circuit board due to the length adjusting error of the cable. Further, in order to dispose the spring in the middle of the roller, the control printed circuit board needs to move to the left side or the right side of the roller, but the length of the cable is increased and the cable is bent in accordance with the movement of the control printed circuit board. Accordingly, as the length of the cable is increased and the cable is bent, when the display device is wound, the thickness of the display device is increased and the reliability during winding and unwinding may be lowered.

Accordingly, in the display device 100 according to the exemplary embodiment of the present disclosure, the wiring line which connects the plurality of source printed circuit boards 140 and the control printed circuit board 150 and the sheet which connects the back cover 110 and the roller 181 are integrated to simplify the structure of the display device 100. The wiring sheet 160 may simultaneously connect the back cover 110 and the roller 181 and connect the source printed circuit board 140 and the control printed circuit board 150 to each other. In this case, the plurality of wiring lines 162 and one pair of sheets 161 are integrally configured so that it is not necessary to consider the difference in the curvatures between the plurality of wiring lines 162 and one pair of sheets 161. Further, the thickness of the wiring lines is not increased according to the direction switching of the plurality of wiring lines 162 so that the plurality of wiring lines 162 may be disposed in various ways and the position of the control printed circuit board 150 in the roller 181 may be easily changed. Accordingly, in the display device 100 according to the exemplary embodiment of the present disclosure, the wiring sheet 160 in which the plurality of wiring lines 162 is disposed between one pair of sheets 161 is used to stably connect the plurality of source printed circuit boards 140 and the control printed circuit board 150. Further, the plurality of wiring lines 162 may be disposed between one pair of sheets 161 in various ways so that the position of the control printed circuit board 150 and the spring 183 may be easily changed in the roller 181 and the distortion of the display unit DP wound around the roller 181 may be minimized.

Figure 7:
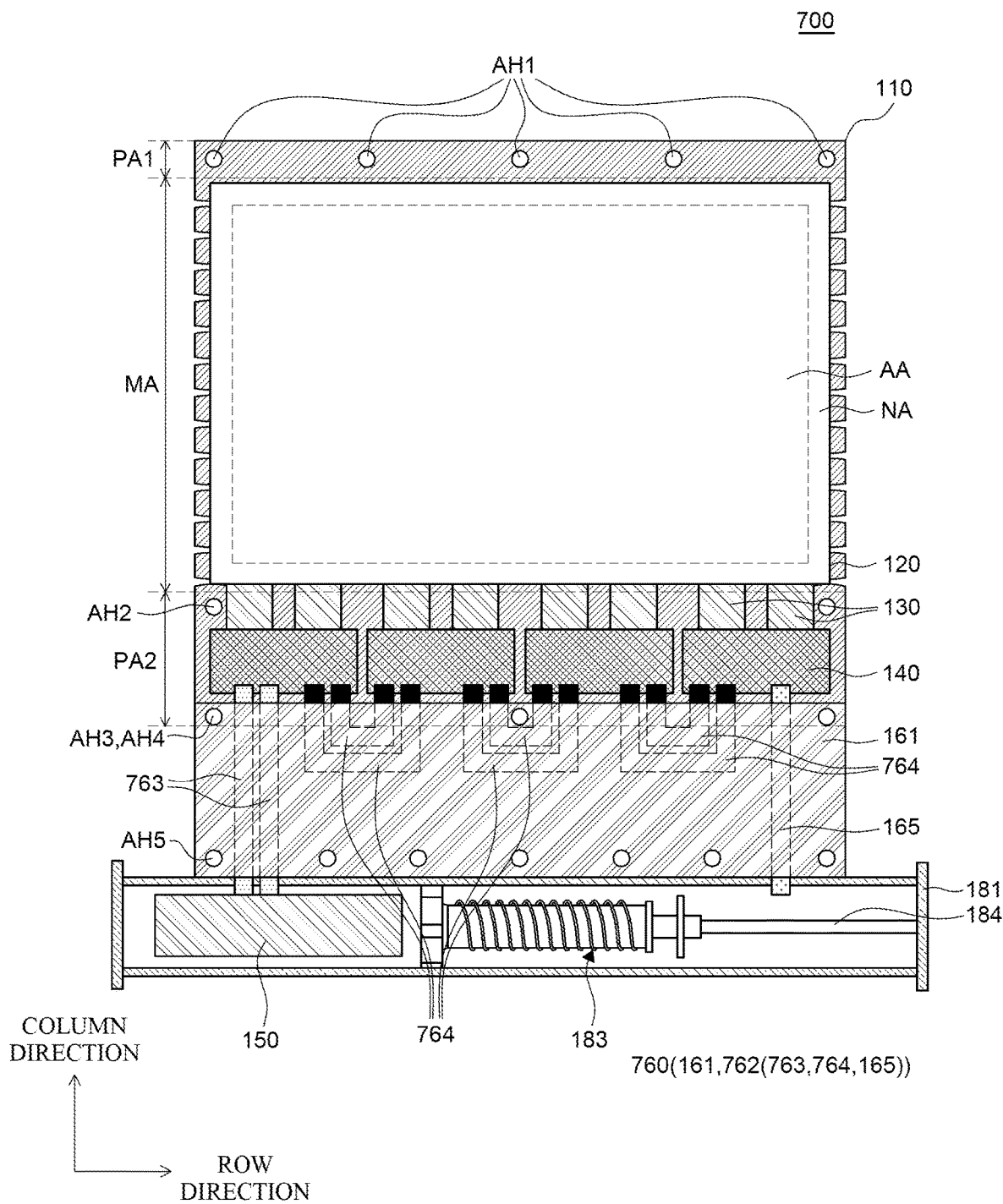
FIG. 7 is a plan view of a display device according to another exemplary embodiment of the present disclosure.

FIG. 7 is a plan view of a display device according to another exemplary embodiment of the present disclosure. The only difference between a display device 700 of FIG. 7 and the display device 100 of FIGS. 1 to 6 is a position of the plurality of wiring lines 762, but the other configuration is substantially the same, so that a redundant description will be omitted.

Referring to FIG. 7, the wiring sheet 760 includes a plurality of wiring lines 762, and the plurality of wiring lines 762 includes a first wiring line 763, a second wiring line 764, and a ground line 165.

The first wiring line 763 is a wiring line which electrically connects the plurality of source printed circuit boards 140 to the control printed circuit board 150. The first wiring line 763 may be connected to a source printed circuit board 140, among the plurality of source printed circuit boards 140, which is the most adjacent to the control printed circuit board 150. For example, when the control printed circuit board 150 is disposed at the left side of the roller 181, the first wiring line 763 may be connected between a leftmost source printed circuit board 140, among the plurality of source printed circuit boards 140, and the control printed circuit board 150. Accordingly, the first wiring line 763 may straightly extend between the source printed circuit board 140 and the control printed circuit board 150.

The plurality of second wiring lines 764 is wiring lines which connect the plurality of source printed circuit boards 140 to each other. The plurality of second wiring lines 764 may electrically connect the source printed circuit board 140 which is supplied with a signal from the control printed circuit board 150 and the remaining source printed circuit boards 140. For example, the plurality of second wiring lines 764 may include a second wiring line 764 which connects a first source printed circuit board 140 from the left and a second source printed circuit board 140, a second wiring line 764 which connects the second source printed circuit board 140 and a third source printed circuit board 140, and a second wiring line 764 which connects the third source printed circuit board 140 and a fourth source printed circuit board 140.

In the display device 700 according to another exemplary embodiment of the present disclosure, the first wiring line 763 is disposed between a source printed circuit board 140, among the plurality of source printed circuit boards 140, which is the most adjacent to the control printed circuit board 150 and the control printed circuit board 150. By doing this, the structure of the first wiring line 763 may be simplified. When the first wiring line 763 is connected to a source printed circuit board 140 having the shortest straight distance from the control printed circuit board 150, among the plurality of source printed circuit boards 140, a length of the first wiring line 763 may be reduced and the first wiring line 763 may be configured as a straight line. Accordingly, the structure of the first wiring line 763 may be simplified. If the first wiring line 763 is connected to a source printed circuit board 140 having the longest straight distance from the control printed circuit board 150, among the plurality of source printed circuit boards 140, a length of the first wiring line 763 needs to be increased. Further, the placement and the shape of the second wiring line 764 which connects the adjacent source printed circuit boards 140 needs to be designed in consideration of the first wiring line 763 which intersects the wiring sheet 760. Accordingly, in the display device 700 according to another exemplary embodiment of the present disclosure, the first wiring line 763 is formed to connect a source printed circuit board 140 having the shortest straight distance from the control printed circuit board 150, among the plurality of source printed circuit boards 140, to the control printed circuit board 150. By doing this, the structure of the plurality of wiring lines 762 may be simplified.

Figure 8:
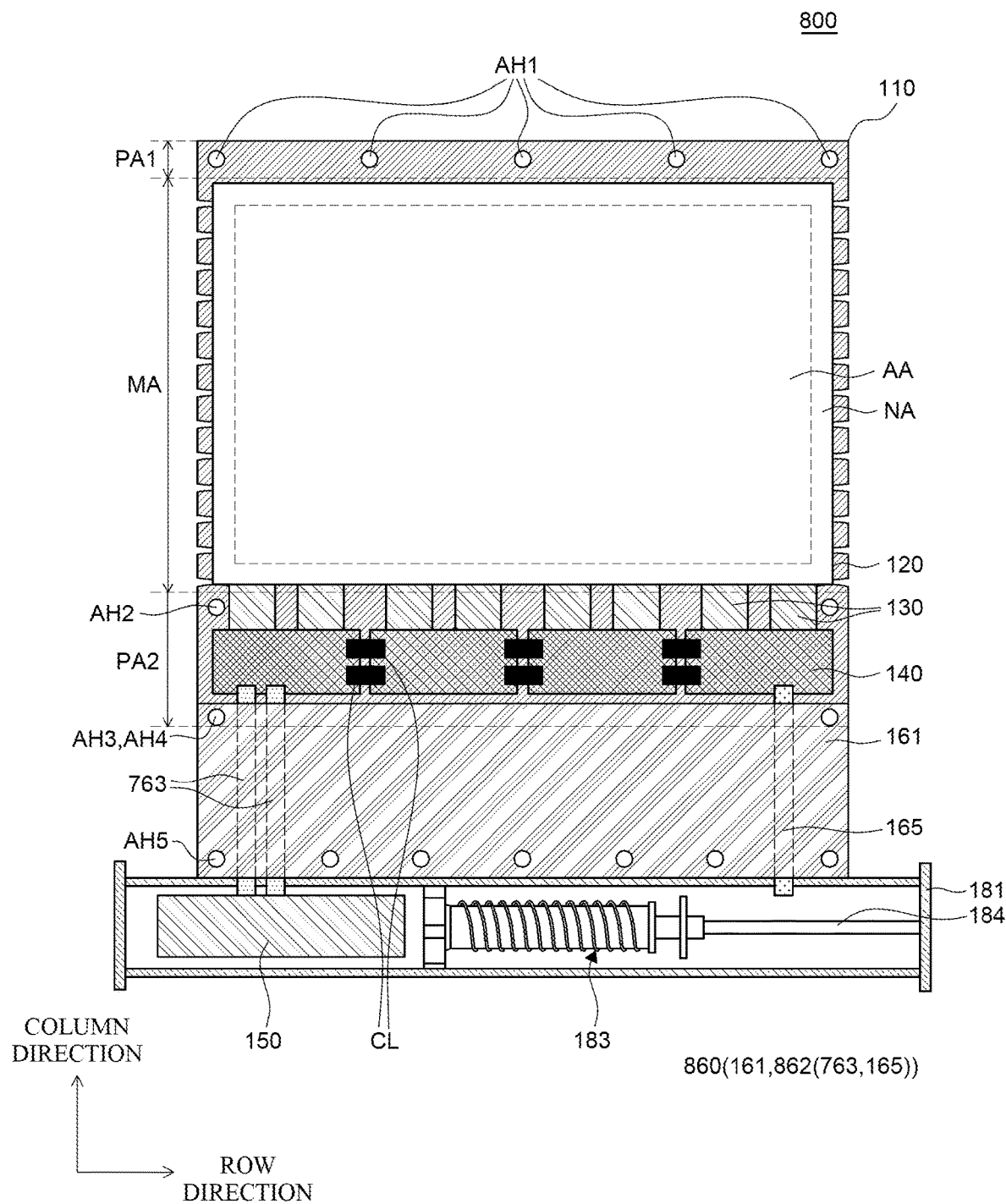
FIG. 8 is a plan view of a display device according to still another exemplary embodiment of the present disclosure.

FIG. 8 is a plan view of a display device according to still another exemplary embodiment of the present disclosure. As compared with the display device 700 of FIG. 7, a display device 800 of FIG. 8 substantially has the same configuration except that a wiring sheet 860 does not include a second wiring line 764 but a connection line CL is further disposed, so that a redundant description will be omitted.

Referring to FIG. 8, the wiring sheet 860 includes one pair of sheets 161 and a plurality of wiring lines 862. The plurality of wiring lines 862 includes a first wiring line 763 and a ground line 165. The plurality of source printed circuit boards 140 and the control printed circuit board 150 may be electrically connected by the first wiring line 763. Accordingly, the wiring sheet 860 may simultaneously electrically connect the control printed circuit board 150 and the plurality of source printed circuit boards 140 and connect the back cover 110 and the roller 181.

A connection line CL is disposed between the plurality of source printed circuit boards 140 to electrically connect the plurality of source printed circuit boards 140. The connection line CL may electrically connect the source printed circuit board 140 which is supplied with a signal from the control printed circuit board 150 and the remaining source printed circuit boards 140. For example, when the control printed circuit board 150 and a first source printed circuit board 140 from the left side are electrically connected by means of the first wiring line 763, a connection line CL which connects the first source printed circuit board 140 and a second source printed circuit board 140, a connection line CL which connects the second source printed circuit board 140 and a third source printed circuit board 140, and a connection line CL which connects the third source printed circuit board 140 and a fourth source printed circuit board 140 may be disposed. At this time, the connection line CL extends in a row direction to be connected to a side portion of each of the source printed circuit boards 140 so that the connection line does not overlap the wiring sheet 860.

In the display device 800 according to still another exemplary embodiment of the present disclosure, the second wiring line which connects the plurality of source printed circuit boards 140 is removed from the wiring sheet 860 and a separate connection line CL is used to simplify the structure of the wiring sheet 860. A signal from the control printed circuit board 150 may be transmitted to the plurality of source printed circuit boards 140. However, each of the plurality of source printed circuit boards 140 is not connected to the control printed circuit board 150 one to one, but only one source printed circuit board 140 may be electrically connected to the control printed circuit board 150 directly. The source printed circuit board 140 which is directly connected to the control printed circuit board 150 may be connected to another source printed circuit board 140 by means of the connection line CL. At this time, the connection line CL may connect the source printed circuit boards 140 at a side portion of the plurality of source printed circuit board 140 at a shortest distance. Accordingly, in the display device 800 according to still another exemplary embodiment of the present disclosure, only the first wiring line 763 and the ground line 165 may be disposed in the wiring sheet 860 without disposing a separate wiring line which connects the source printed circuit boards 140, and the structure of the wiring sheet 860 may be simplified.

Figure 9:
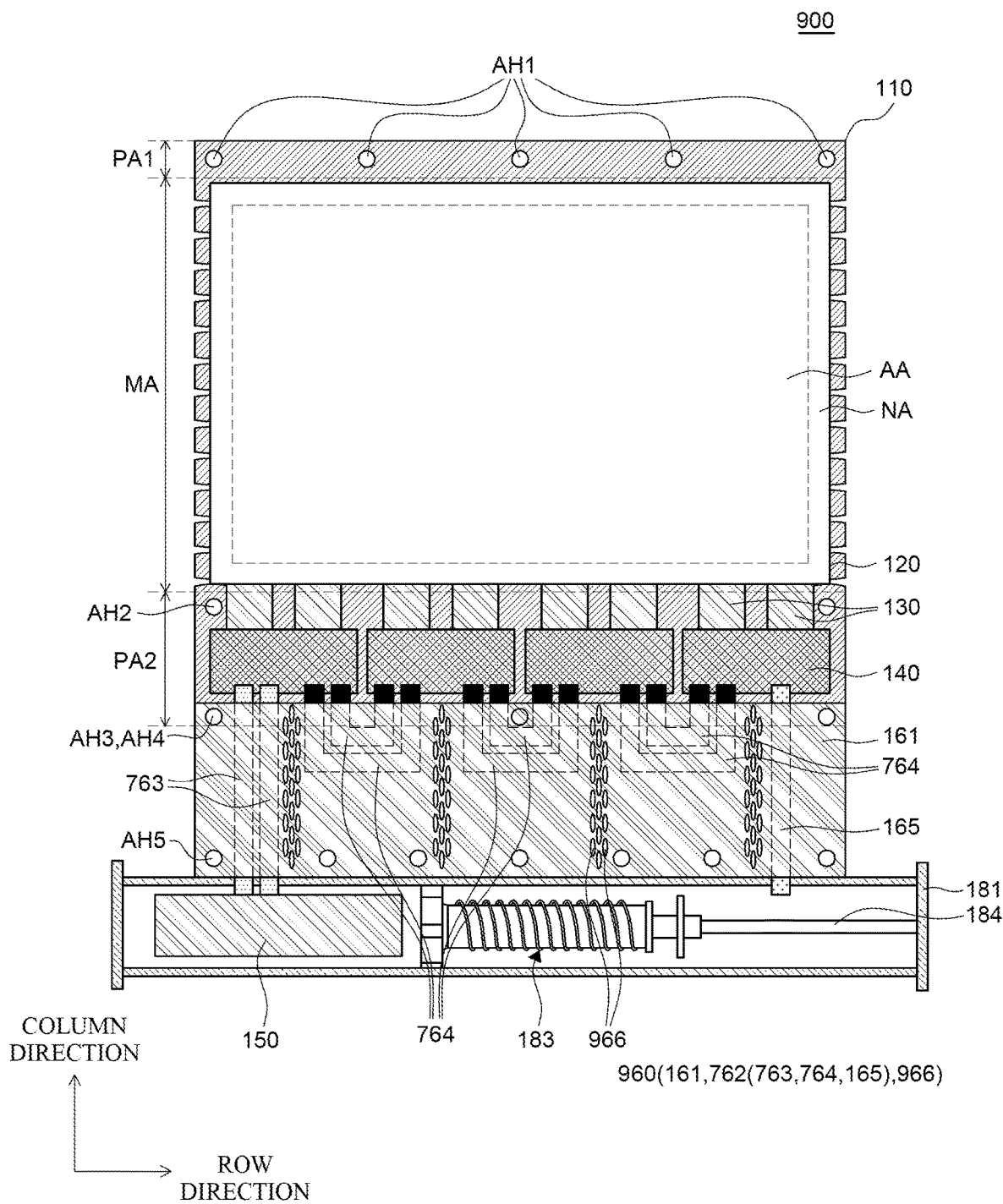
FIG. 9 is a plan view of a display device according to still another exemplary embodiment of the present disclosure.
Figure 10:
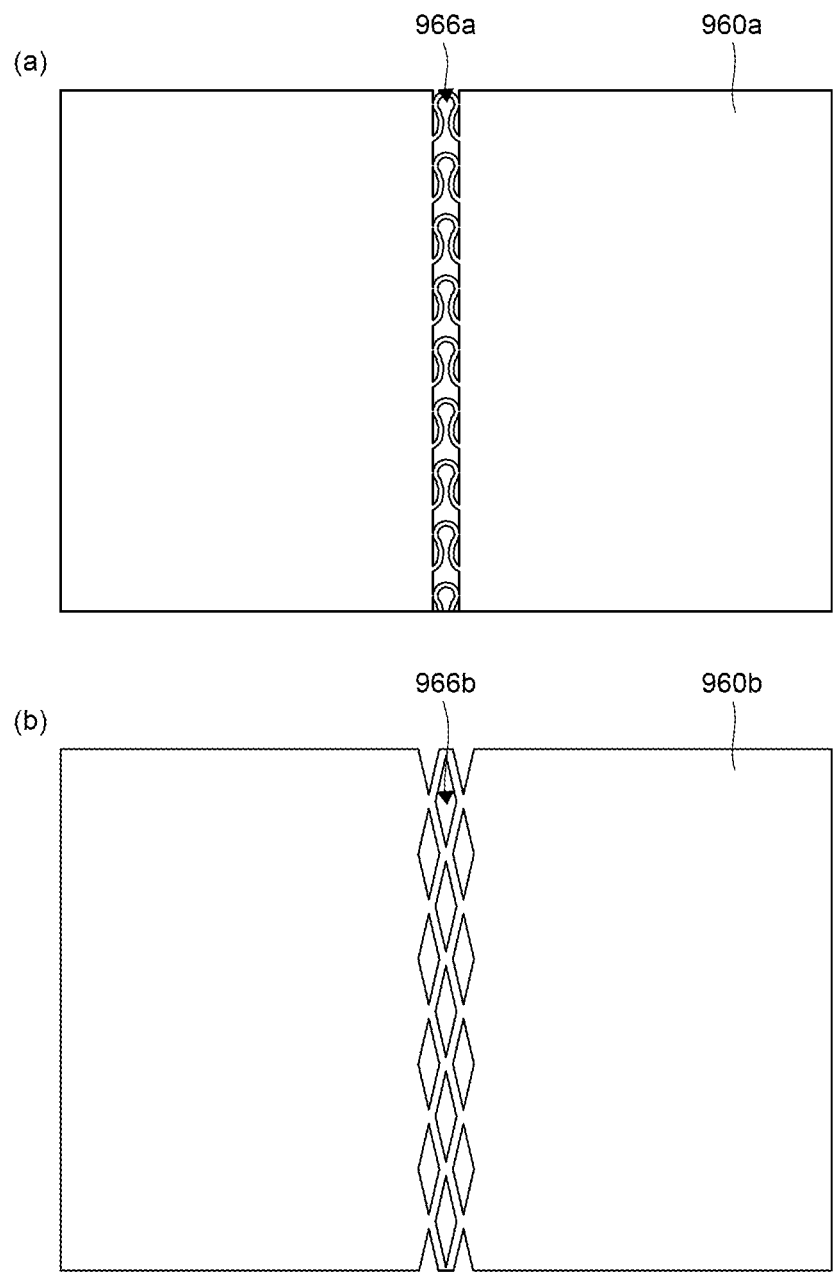
FIG. 10 is an enlarged plan view of a display device according to various exemplary embodiments of the present disclosure.

FIG. 9 is a plan view of a display device according to still another exemplary embodiment of the present disclosure. FIG. 10 is an enlarged plan view of a display device according to various exemplary embodiments of the present disclosure. FIG. 10 is a plan view enlarging a wiring sheet including a plurality of holes. As compared with the display device 700 of FIG. 7, a display device 900 of FIGS. 9 and 10 substantially has the same configuration except that a wiring sheet 960 further includes a plurality of holes 966, 966a, and 966b so that a redundant description will be omitted.

Referring to FIG. 9, the wiring sheet 960 includes a plurality of holes 966. In the wiring sheet 960, the plurality of holes 966 may be disposed to be spaced apart from the plurality of wiring lines 762. A length direction of the plurality of holes 966 may be perpendicular to a length direction of the roller 181. That is to say, the plurality of holes 966 may be disposed along a direction perpendicular to a length direction of the roller 181. Furthermore, a width of the plurality of holes 966 in a column direction may be larger than a width in a row direction. For example, the plurality of holes 966 may have an oval shape having a major axis in a column direction.

The width of the plurality of holes 966 in the column direction is relatively large so that the plurality of holes may easily contract or expand in the row direction. Therefore, the plurality of holes 966 may extend in a row direction and the length of the wiring sheet 960 in the row direction may be flexibly deformed. Even though an alignment error of the plurality of wiring lines 762 of the wiring sheet 960 is caused, the alignment error may be compensated while the plurality of holes 966 is flexibly deformed. Specifically, as the size of the display device 900 is increased, the length of the wiring sheet 960 in the row direction may be increased and the number of source printed circuit boards 140 may be also increased. At this time, the alignment error may be caused at a connection location of the plurality of wiring lines 762 of the wiring sheet 960 and the source printed circuit board 140. For example, when a length of the wiring sheet 960 in the row direction is shorter than that as designed, some wiring lines among the plurality of wiring lines 762 are biased from the source printed circuit board 140 to be connected so that it may be difficult to connect the plurality of wiring lines 762 and the source printed circuit board 140. However, the plurality of holes 966 contracts or expands in a row direction so that the wiring sheet 960 may be flexibly deformed in the row direction so that the plurality of wiring lines 762 and the source printed circuit board 140 which are biased may be easily aligned so that the alignment error may be compensated.

In the meantime, the plurality of holes 966 may be formed in various forms other than that illustrated in FIG. 9. For example, in a wiring sheet 960a of (a) of FIG. 10, a width of the plurality of holes 966a in the row direction is shorter than a width in the column direction and an upper end and a lower end may be asymmetrical to each other with respect to the center. For example, in a wiring sheet 960b of (b) of FIG. 10, a width of the plurality of holes 966b in the row direction is shorter than a width in the column direction and an upper end and a lower end may be symmetrical to each other with respect to the center. For example, the plurality of holes 966b may form a rhombic shape.

In the display device 900 according to various exemplary embodiments of the present disclosure, a plurality of holes 966, 966a, and 966b is formed in the wiring sheets 960, 960a, and 960b to compensate for the alignment error of the plurality of wiring lines 762. The plurality of holes 966, 966a, and 966b formed in the wiring sheets 960, 960a and 960b is configured such that a width in the row direction is smaller than a width in the column direction so that the plurality of holes may easily contract or expand in the row direction. Further, the wiring sheets 960, 960a, and 960b may also easily contract or expand in the row direction by the plurality of holes 966, 966a, and 966b. If lengths of the wiring sheets 960, 960a, and 960b in the row direction have an error which is different from the design, the plurality of wiring lines 762 is biased from the source printed circuit board 140 so that it may be difficult to connect the plurality of wiring lines 762 and the source printed circuit board 140. However, in the display device 900 according to various exemplary embodiments of the present disclosure, the wiring sheets 960, 960a, and 960b contract or expand in the row direction by the plurality of holes 966, 966a, and 966b to compensate for the alignment error between the plurality of wiring lines 762 and the plurality of source printed circuit board 140. Further, the plurality of wiring lines 762, the plurality of source printed circuit boards 140, and the control printed circuit board 150 may be easily connected.

The exemplary embodiments of the present disclosure can also be described as follows:

a display device according to an aspect of the present disclosure may comprise a display panel, a plurality of flexible films electrically connected to one end of the display panel, a source printed circuit board electrically connected to the plurality of flexible films, a roller on which the display panel is wound or unwound, a control printed circuit board disposed in the roller and a wiring sheet including a first wiring line electrically connecting at least one of the plurality of source printed circuit boards and the control printed circuit board.

According to another feature of the present disclosure, the display device may further comprise a spring disposed in the roller, wherein the spring may be disposed in the middle of the roller and the control printed circuit board may be disposed to be adjacent to a side surface of the roller.

According to yet another feature of the present disclosure, the wiring sheet may include one pair of sheets bonded to each other with the first wiring line therebetween and a second wiring line which is at least partially disposed between the pair of sheets and connects the plurality of source printed circuit boards to each other.

According to yet another feature of the present disclosure, the wiring sheet may further include a plurality of holes disposed in the pair of sheets.

According to yet another feature of the present disclosure, the display device may further comprise a connection line disposed between each of the plurality of source printed circuit boards to electrically connect the plurality of source printed circuit boards.

According to yet another feature of the present disclosure, the display device may further comprise a back cover supporting the display panel on a rear surface of the display panel, wherein one end of the wiring sheet is fastened with the back cover and the other end of the wiring sheet is fastened with the roller.

a display device according to another aspect of the present disclosure comprises a display panel, a plurality of source printed circuit boards electrically connected to the display panel, a control printed circuit board electrically connected to the plurality of source printed circuit boards, a wiring sheet electrically connecting the plurality of source printed circuit boards and the control printed circuit board and a roller connected to the wiring sheet and accommodating the control printed circuit boards therein, wherein the spring is disposed in the middle of the roller.

According to another feature of the present disclosure, the wiring sheet may include a first wiring line electrically connecting one of the plurality of source printed circuit boards and the control printed circuit boards and one pair of sheets bonded to each other with the first wiring line therebetween, wherein the other end of the first wiring line is extended into the roller from the pair of sheets.

According to yet another feature of the present disclosure, the wiring sheet may further include a second wiring line partially disposed between the pair of sheets to electrically connect the plurality of source printed circuit boards to each other.

According to yet another feature of the present disclosure, the display device may further comprise a connection line electrically connecting adjacent source printed circuit boards among the plurality of source printed circuit boards, wherein the connection line may be extended in a row direction.

According to yet another feature of the present disclosure, the display device may further comprise a back cover supporting the display panel and the plurality of source printed circuit boards, wherein the back cover may be connected to the wiring sheet in an area between the plurality of source printed circuit boards.

According to yet another feature of the present disclosure, the wiring sheet may further include a ground line disposed between the pair of sheets to electrically connect the plurality of source printed circuit boards and the roller.

According to yet another feature of the present disclosure, the wiring sheet may further include a plurality of holes disposed in the pair of sheets to be spaced apart from the first wiring line, wherein a length direction of the plurality of holes may be perpendicular to a length direction of the roller.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel;
   a plurality of flexible films electrically connected to the display panel;
   a plurality of source printed circuit boards electrically connected to the plurality of flexible films;
   a roller, the display panel configured to be wound around the roller or unwound from the roller;
   a control printed circuit board disposed in the roller; and
   a wiring sheet including a first wiring line electrically connecting at least one of the plurality of source printed circuit boards and the control printed circuit board,
   wherein the wiring sheet includes a pair of sheets bonded to each other with the first wiring line disposed between the pair of sheets.

2. The display device according to claim 1, further comprising:
   a spring disposed in the roller,
   wherein the spring is disposed in a middle of the roller and the control printed circuit board is disposed adjacent to a side surface of the roller.

3. The display device claim 1, wherein the wiring sheet further includes a second wiring line at least partially disposed between the pair of sheets, the plurality of source printed circuit boards electrically connected to each other via the second wiring line.

4. The display device according to claim 3, wherein the wiring sheet further includes a plurality of holes disposed in the pair of sheets.

5. The display device according to claim 1, further comprising:
a connection line between each of the plurality of source printed circuit boards, the plurality of source printed circuit boards electrically connected to each other via the connection line.

6. The display device according to claim 1, further comprising:
a back cover disposed on a rear surface of the display panel to support the display panel,
wherein a first end of the wiring sheet is coupled to the back cover and a second end of the wiring sheet is coupled to the roller.

7. A display device, comprising:
a display panel;
a plurality of source printed circuit boards electrically connected to the display panel;
a control printed circuit board;
a wiring sheet, the plurality of source printed circuit boards electrically connected to the control printed circuit board via the wiring sheet;
a roller coupled to the wiring sheet, the control printed circuit board in the roller; and
a spring disposed in a middle of the roller,
wherein the wiring sheet includes:
a first wiring line, one of the plurality of source printed circuit boards electrically connected to the control printed circuit board via the first wiring line; and
a pair of sheets bonded to each other with the first wiring line between the pair of sheets,
wherein an end of the first wiring line extends from the pair of sheets into the roller.

8. The display device according to claim 7, wherein the wiring sheet further includes:
a second wiring line partially disposed between the pair of sheets, the plurality of source printed circuit boards electrically connected to each other via the second wiring line.

9. The display device according to claim 7, further comprising:
a connection line, adjacent source printed circuit boards of the plurality of source printed circuit boards electrically connected to each other by the connection line,
wherein the connection line extends in a row direction of the plurality of source printed circuit boards.

10. The display device according to claim 7, further comprising:
a back cover coupled to the display panel and the plurality of source printed circuit boards,
wherein the back cover is connected to the wiring sheet in an area between the plurality of source printed circuit boards.

11. The display device according to claim 7, wherein the wiring sheet further includes:
a ground line disposed between the pair of sheets, the plurality of source printed circuit boards and the roller electrically connected via the ground line.

12. The display device according to claim 7, wherein the wiring sheet further includes:
a plurality of holes disposed in the pair of sheets and spaced apart from the first wiring line,
wherein a length direction of the plurality of holes is perpendicular to a length direction of the roller.

* * * * *